United States Patent
Borden

(10) Patent No.: US 7,838,400 B2
(45) Date of Patent: Nov. 23, 2010

(54) RAPID THERMAL OXIDE PASSIVATED SOLAR CELL WITH IMPROVED JUNCTION

(75) Inventor: Peter Borden, San Mateo, CA (US)

(73) Assignee: Applied Materials, Inc., Santa Clara, CA (US)

(*) Notice: Subject to any disclaimer, the term of this patent is extended or adjusted under 35 U.S.C. 154(b) by 197 days.

(21) Appl. No.: 12/175,357

(22) Filed: Jul. 17, 2008

(65) Prior Publication Data

US 2010/0015749 A1 Jan. 21, 2010

(51) Int. Cl.
H01L 21/26 (2006.01)
H01L 21/42 (2006.01)

(52) U.S. Cl. .............. 438/513; 438/508; 438/475; 438/769; 257/E21.042; 257/E21.077; 257/E21.079; 257/E21.227; 257/E21.229; 257/E21.267; 257/E21.278; 257/E21.311

(58) Field of Classification Search .......... 438/513, 438/505, 508, 509, 474, 475, 663, 521, 723, 438/752, 745, 769; 257/E21.042, 77, 79, 257/227, 229, 267, 278, 311
See application file for complete search history.

(56) References Cited

U.S. PATENT DOCUMENTS

| | | | |
|---|---|---|---|
| 6,734,091 B2 * | 5/2004 | Oh et al. ............... | 438/605 |
| 6,936,844 B1 | 8/2005 | Yamazaki et al. | |
| 6,998,288 B1 * | 2/2006 | Smith et al. ............. | 438/48 |
| 7,098,085 B2 | 8/2006 | Yamanaka et al. | |
| 7,183,229 B2 | 2/2007 | Yamanaka | |
| 7,365,393 B2 | 4/2008 | Yamazaki et al. | |
| 7,468,485 B1 * | 12/2008 | Swanson ............... | 136/243 |
| 2006/0130891 A1 * | 6/2006 | Carlson ................ | 136/256 |
| 2007/0137692 A1 * | 6/2007 | Carlson ................ | 136/252 |

OTHER PUBLICATIONS

B. Hartiti, et al., Towards High-efficiency Silicon Solar Cells by Rapid Thermal Processing, Progress in Photovoltaics: Research and Applications, vol. 2, pp. 129-142 (1994).

* cited by examiner

*Primary Examiner*—David Nhu
(74) *Attorney, Agent, or Firm*—Patterson & Sheridan, LLP

(57) ABSTRACT

A method of manufacturing a solar cell is provided. One surface of a semiconductor substrate is doped with a n-type dopant. The substrate is then subjected to a thermal oxidation process to form an oxide layer on one or both surfaces of the substrate. The thermal process also diffuses the dopant into the substrate, smoothing the concentration profile. The smoothed concentration gradient enables the oxide layer to act as a passivating layer. Anti-reflective coatings may be applied over the oxide layers, and a reflective layer may be applied on the surface opposite the doped surface to complete the solar cell.

19 Claims, 3 Drawing Sheets

RAPID THERMAL OXIDE PASSIVATED SOLAR CELL WITH IMPROVED JUNCTION

BACKGROUND OF THE INVENTION

1. Field of the Invention

Embodiments of the present invention generally relate to photovoltaic/solar cell and solar panel manufacturing.

2. Description of the Related Art

Photovoltaics (PV) systems can generate power for many uses, such as remote terrestrial applications, battery charging for navigational aids, telecommunication equipments, and consumer electronic devices, such as calculators, watches, radios, etc. One example of PV systems includes a stand-alone system which generates power for direct use or with local storage. Another type of PV system is connected to conventional utility grid with the appropriate power conversion equipment to produce alternating current (AC) compatible with any conventional utility grid.

PV or solar cells are material junction devices which convert sunlight into direct current (DC) electrical power. When exposed to sunlight (consisting of energy from photons), the electric field of solar cell p-n junctions separates pairs of free electrons and holes, thus generating a photo-voltage. A circuit from n-side to p-side allows the flow of electrons when the solar cell is connected to an electrical load, while the area and other parameters of the PV cell junction device determine the available current. Electrical power is the product of the voltage times the current generated as the electrons and holes recombine.

Currently, solar cells and PV panels are manufactured by starting with many small silicon sheets or wafers as material units and processing them into individual photovoltaic cells before they are assembled into PV modules and solar panels. These silicon sheets are generally saw-cut p-type boron doped silicon sheets less than about 0.3 mm thick, precut to the sizes and dimensions that will be used, e.g., 100 mm×100 mm, or 156 mm×156 mm. The cutting (sawing) or ribbon formation operation on the silicon sheets damages the surfaces of the precut silicon sheets to some degree, and etching processes using, for example, alkaline or acid etching solutions are performed on both surfaces of the silicon sheets to remove about ten to twenty microns of material from each surface and provide textures thereon.

Junctions are then formed by diffusing an n-type dopant onto the precut p-type silicon sheets, generally performed by phosphorus diffusion as phosphorus is widely used as the n-type dopant for silicon in solar cells. One phosphorus diffusion process includes coating phosphosilicate glass compounds onto the surface of the silicon sheets and performing diffusion/annealing inside a furnace. Another example of diffusing a phosphorus dopant into silicon includes bubbling nitrogen gas through liquid phosphorus oxychloride ($POCl_3$) sources which are injected into an enclosed quartz furnace loaded with batch-type quartz boats containing the silicon sheets. Typically, a high temperature between about 850° C. and about 1,050° C. is needed to form and create a p-n junction depth of about 0.1 microns up to about 0.5 microns.

Following dopant diffusion, a phosphorus-doped $SiO_2$ layer formed during the diffusion is generally removed with a wet etch. One or both surfaces of a PV cell can also be coated with suitable dielectrics after the p-n junction is formed. Dielectric layers are used to minimize surface charge carrier recombination and some dielectric materials, such as silicon dioxide, titanium dioxide, or silicon nitride, can be provided as antireflective coating to reduce reflection losses of photons.

The front or sun facing side of the PV cell is then covered with an area-minimized metallic contact grid for transporting current and minimizing current losses due to resistance through silicon-containing layers. Some blockage of sunlight or photons by the contact grid is unavoidable but can be minimized. The bottom of the PV cell is generally covered with a back metal which provides contact for good conduction as well as high reflectivity. Metal grids with patterns of conductive metal lines are used to collect current. Generally, screening printing thick-film technology is used in the PV cell industry to layer a conductive paste of metal materials, e.g., silver, etc., into a desired pattern and deposit a metal material layer to the surface of the silicon sheets or substrates for forming metal contact fingers or wiring channels on the front and/or back side of the solar cell. Other thin film technologies may be used for contact formation or electrode processing. The deposited metal layer, formed into contacts, is often dried and then fired or sintered at high temperature to form into good conductors in direct contact with underlying silicon materials, and a single PV cell is made. Generally, both silver and aluminum are contained in the screen printing paste for forming back side contacts with good contact conductor to silicon material and easy soldering.

Manufacturing high efficiency solar cells at low cost (providing low unit cost per Watt) is the key to making solar cells more competitive in the generation of electricity for mass consumption. Even small improvements in cost per Watt substantially increases the size of the available market. The efficiency of solar cells is directly related to the ability of a cell to collect charges generated from absorbed photons in the various layers. When electrons and holes re-combine, the incident solar energy is re-emitted as heat or light. The need to improve the efficiency of solar cells through use of low cost processes remains.

SUMMARY OF THE INVENTION

Embodiments of the invention generally provide methods of manufacturing a solar cell. Some embodiments provide a method of forming a solar cell on a semiconductor substrate comprising doping a first surface of the substrate with a n-type dopant, applying a passivating layer to the first surface of the substrate, and to a second surface of the substrate, applying an anti-reflective coating to the first and second surfaces of the substrate, and forming a metallic reflective coating over the second surface. The passivating layer may be a dielectric layer, such as an oxide or nitride layer, and may be formed by a thermal process which diffuses the dopant into the substrate.

Other embodiments of the invention provide a method of passivating a doped solar cell substrate, comprising disposing the substrate in a processing chamber, providing a gas mixture comprising oxygen to the processing chamber; and heating the substrate to a predetermined temperature selected to form an oxygen-containing film on at least two surfaces of the substrate and to cause dopants in the doped solar cell substrate to diffuse into the substrate. The heating process may comprise a rapid thermal oxidation process, and may be adapted to smooth the concentration gradient of dopant in the substrate.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The invention generally provides methods for treating a substrate in a solar cell manufacturing process. In one aspect, a method of forming a solar cell on a semiconductor substrate is provided, comprising doping a first surface of the substrate with an n-type dopant, applying a passivating layer to the first surface of the substrate, and to a second surface of the substrate, applying an anti-reflective coating to the first and second surfaces of the substrate, and forming a metallic reflective coating over the second surface. In many embodiments, the n-type dopant is phosphorus. Phosphorus is generally applied as a dopant by subjecting an exposed semiconductor surface, such as a silicon surface, to a phosphorus-containing gas, such as phosphorus oxychloride (POCl), under high temperature to form a phosphorus-containing oxide layer on the exposed semiconductor surface. Phosphorus diffuses from the phosphorus-containing oxide layer into the semiconductor surface. The remaining phosphorus-containing oxide layer is generally stripped by a wet etch process, which may be a phosphorus etch process, leaving the semiconductor substrate with a n-doped layer on one surface.

Figure 1:
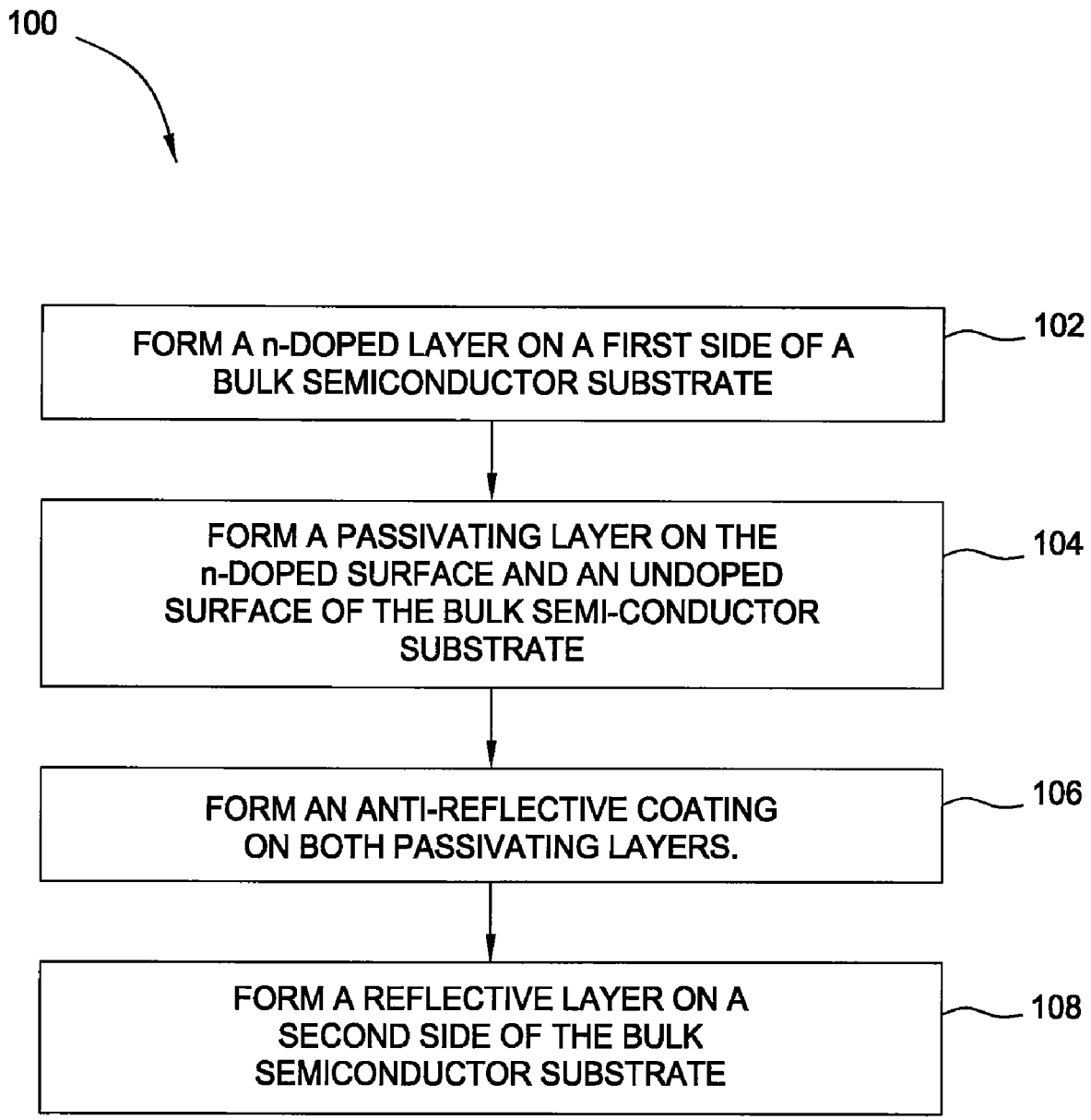
FIG. 1 is a flow diagram summarizing a method according to one embodiment of the invention.

FIG. 1 is a process flow diagram summarizing a method 100 according to one embodiment of the invention. At 102, an n-doped layer is formed on a first side of a bulk semiconductor substrate. The n-doped layer may be formed by any process known to the art, such as the process described briefly above. The n-doped layer is generally a thin layer, and may have thickness between about 0.1 micrometers (µm) and about 1.0 µm, such as about 0.5 µm. In most embodiments, the doping process will produce a concentration profile of dopant in the semiconductor surface that is highest at the surface, and falls rapidly with depth. In many embodiments, the dopant concentration will be between about $10^{19}$ cm$^{-3}$ and $10^{21}$ cm$^{-3}$ at the surface and will fall below $10^{17}$ cm$^{-3}$ at a depth of 0.2 µm. The decay rate of concentration in such doped layers is sometimes as high as 50 nanometers per decade of concentration (nm/dec). A high concentration of dopant remains at the surface of the solar cell, and may reduce the effectiveness of passivating layers applied to maintain charge separation.

The efficiency of the solar cell can be improved by reducing the surface concentration of dopant, diffusing the dopant into the bulk semiconductor layer while passivating the surface. At 104, a passivating layer is formed on the n-doped surface, and on an undoped surface, of the bulk semiconductor layer. The process of forming the passivating layer will preferably be performed under an atmosphere substantially free of dopant, and in a way that diffuses the surface dopant into the bulk semiconductor layer. The passivating layer may be formed during a high-temperature process designed to encourage the desired diffusion, such as a thermal treatment process. In some embodiments, the passivating layer may be formed in a rapid thermal oxidation process. In other embodiments, the surface may be exposed to an oxygen-containing plasma or to a nitrogen-containing plasma. In still other embodiments, the surface may be exposed to nitrogen or to a nitrogen-containing gas such as ammonia.

In embodiments featuring forming a passivating layer by exposing the substrate to a rapid thermal oxidation process, the substrate is exposed to an oxygen-containing gas at high temperature. The substrate is disposed in a thermal treatment chamber, and a gas mixture is provided to the chamber. The gas mixture usually comprises oxygen, and may comprise other gases such as hydrogen and water vapor. The gas may additionally be ionized to any convenient degree. The substrate is rapidly heated in the presence of the gas mixture to a target temperature between about 800° C. and about 1,200° C. for between about 9 and about 120 seconds at a pressure of between about 100 milliTorr (mTorr) and about 10 Torr, such as about 850 mTorr. The rate of heating may be between about 200° C./sec and about 400° C./sec in some embodiments. Such heating rates may be achieved by use of a heated support or by use of radiant energy sources such as heat lamps. The RadOx™ process available from Applied Materials, Inc., of Santa Clara, Calif., may be used to form the passivating layer in a way that diffuses the dopant into the bulk layer. In embodiments using the RadOx process, the substrate may be beneficially treated in less than about 30 seconds.

In some embodiments, the passivating layer is applied only to the n-doped surface, and a separate passivating layer is applied to the second surface. In some embodiments, the second surface may be doped with a p-type dopant such as boron prior to passivation. Subjecting the substrate to a high-temperature process modifies the concentration profile of dopant in the substrate. Prior to high-temperature treatment, the dopant concentration may have a decay rate of between about 50 nm/dec and about 100 nm/dec, such as about 90 nm/dec. After the high-temperature treatment, the dopant concentration may have a decay rate of between about 100 nm/dec and about 300 nm/dec, such as about 200 nm/dec. In one embodiment, the high-temperature treatment will be performed at a temperature selected to diffuse the dopant from the surface of the substrate into the bulk, producing a region of slow concentration decay near the surface of the substrate, and a region of fast concentration decay deeper in the substrate. The region of slow concentration decay may have a rate of concentration decay between about 0.5 µm/dec and about 1.0 µm/dec, such as about 0.8 µm/decade. The region of fast concentration decay may have a rate of concentration decay between about 50 nm/dec and about 100 nm/dec, such as about 70 nm/dec. In some embodiments, the region of slow concentration decay may have a thickness of between about 100 nm and about 300 nm, such as about 200 nm, and the region of fast concentration decay may have a thickness of between about 100 nm and about 300 nm, such as about 200 nm. Thus, the process of passivating the substrate is performed so as to smooth the concentration profile of the dopant, generally reducing the rate of decay of concentration with depth. Smoothing the concentration profile in this way aids in passivating the substrate because it provides a deeper n-doped layer to absorb holes and repel electrons from the bulk layers.

Subjecting the substrate to a high-temperature process to form a passivating layer causes movement of dopant atoms in the substrate. For this reason, it is preferred to perform initial diffusion of dopant to a shallower depth than would otherwise be desired. For example, a junction intended to have a dopant layer 0.3 µm thick may be subjected to initial diffusion to a depth of 0.1 µm, and the dopant diffused to a depth of 0.3 µm during the passivation process. This reduces the time required for the initial diffusion process.

Figure 2A:
FIGS. 2A-2D are schematic side views of a substrate being subjected to the method of FIG. 1.

FIGS. 2A-2D are schematic side views of a substrate at various stages of the process of FIG. 1. In FIG. 2A, a semiconductor substrate 202, which may be silicon, is coated with a dopant 204. In most embodiments, the dopant 204 is an n-type dopant such as phosphorus. In some embodiments, however, other n- or p-type dopants may be used, such as boron or arsenic. The dopant 204 diffuses into the surface of the substrate 202 to form a thin doped layer with sharply declining dopant concentration at the interface between the substrate 202 and the dopant 204. The doped layer may be from about 100 nm to about 500 nm thick in most embodiments, and may be about 200 nm thick in a preferred embodiment.

Figure 2B:
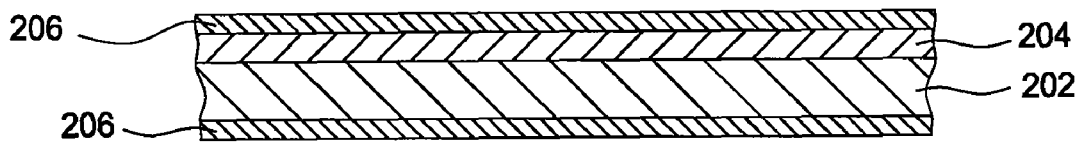

In FIG. 2B, a passivating layer 206 is formed over the dopant layer 204 on one side of the substrate 202, and over the bare semiconductor surface on the other side of the substrate 202. The passivating layer may be an oxide or nitride layer, but is preferably formed in a high temperature process that additionally results in diffusion of the dopant 204 deeper into the substrate 202. In most embodiments, the passivating layers 206 will be from about 20 Angstroms to about 150 Angstroms thick, such as between about 40 Angstroms to about 100 Angstroms thick, for example 50 Angstroms thick. In some embodiments, the thermal treatment process that forms the passivating layer reduces surface dopant concentration by at least 10%, and in some embodiments by 50-90%. In other embodiments, the high temperature process smoothes the concentration of dopant, extending it deeper into the substrate. In some embodiments, the concentration gradient from the surface of the substrate to the bottom of the doped region is reduced by at least 50%. In one exemplary embodiment, the rate of decay of concentration before the thermal treatment is between about 50 nm/dec and about 100 nm/dec, and after the thermal treatment is between about 100 nm/dec and about 300 nm/dec. In some embodiments, the thickness of the doped layer after the thermal treatment is between about 0.5 µm and about 1.0 µm. The embodiment of FIG. 2B shows the passivating layer 206 formed on both sides of the substrate 202, but in some embodiments, the passivating layer may be formed only on the doped side of the substrate 202.

In some embodiments, the back side is doped with a dopant of the same type as the substrate, to form a back surface field layer. For example, a p-type substrate may have boron diffused into the back surface. In other embodiments, the back side is doped with a dopant of the opposite type as the substrate to form a floating junction.

Figure 2C:
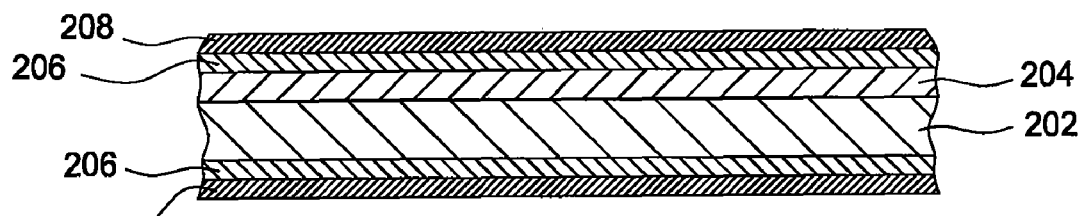

In FIG. 2C, dielectric layers 208 are formed over the passivating layers 204. The dielectric layers may comprise oxygen, nitrogen, aluminum, and carbon, and may also be passivating and/or anti-reflective layers. In some embodiments, a dielectric layer such as the dielectric layers 208 of FIG. 2C may be deposited on only one side of the substrate. For example, a dielectric layer 208 may be formed on only the doped side of the substrate 202. The dielectric layers 208 may comprise oxygen, nitrogen, carbon, hydrogen, or combinations thereof. In some embodiments, a nitride layer, optionally containing oxygen, carbon, hydrogen, or combinations thereof, may be formed on one or more surfaces of the substrate to provide further passivation and to act as an anti-reflective coating. The anti-reflective coating prevents loss of incident radiation through reflection. In other embodiments, an oxide layer, optionally containing nitrogen, carbon, hydrogen, aluminum, or combinations thereof, may be formed. In some embodiments, the dielectric layers 208 may have a dielectric constant less than about 6, such as between about 2 and about 6, for example less than about 4. In other embodiments, the dielectric layer may have low dielectric constant between about 2 and about 4, such as less than about 3. In some embodiments, the dielectric layers 208 may have a thickness less than about 100 nm, such as between about 50 nm and about 100 nm, for example about 70 nm. In alternate embodiments, the dielectric layer may be applied only to the doped surface of the substrate.

Figure 2D:
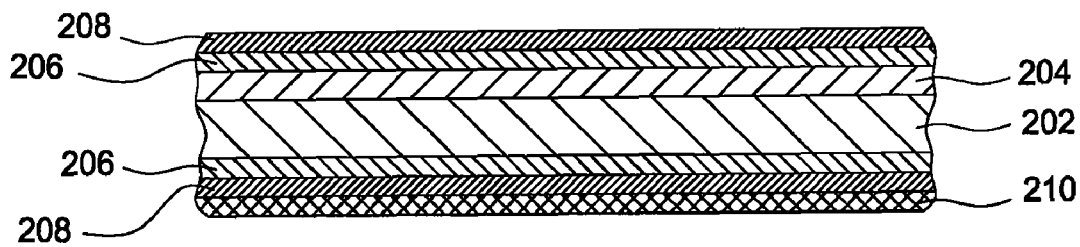

In FIG. 2D, a reflective layer 210 is shown formed on the side of the substrate opposite the doped side. In some embodiments, such a reflective layer is used to capture incident radiation that might otherwise be transmitted through the substrate, reflecting it back into the solar cell. The reflective layer may be a thin layer of aluminum or other suitable metal diffused into the substrate surface. The reflective layer will generally only be used in embodiments featuring an anti-reflective dielectric layer applied to both surfaces of the substrate, such as the embodiment shown in FIG. 2C. It should be noted that that back-side anti-reflective coating and diffusion reflective layer are optional.

Figure 3:
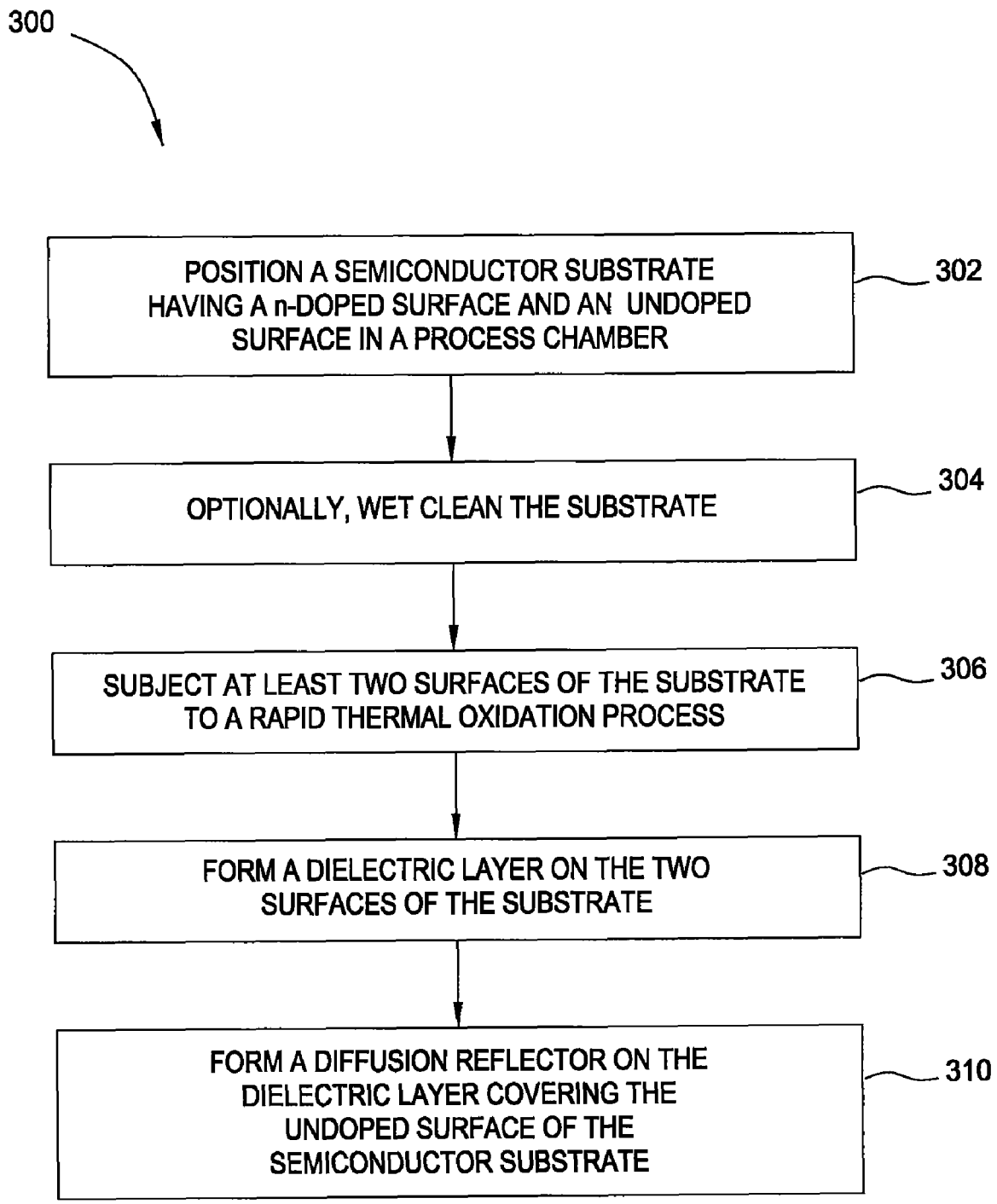
FIG. 3 is a flow diagram summarizing a method according to another embodiment of the invention.

FIG. 3 is a flow diagram summarizing a method 300 according to another embodiment of the invention. At 302, a semiconductor substrate having an n-doped surface and an undoped surface is positioned in a process chamber. At 304, the semiconductor substrate may optionally be wet cleaned to remove any native oxide or other impurity and to expose a bare semiconductor surface. The wet clean process may comprise treatment with any of the widely known wet clean reagents, such as various solutions of HF incorporating water, peroxide, alcohol, organic acids, and the like.

At 306, at least two surfaces of the substrate are subjected to a rapid thermal oxidation process. The substrate is exposed to a gas mixture comprising oxygen, and heat is applied to oxidize the surfaces. In some embodiments, the gas mixture may also comprise nitrogen, hydrogen, carbon, or mixtures thereof. Some embodiments may add water to the gas mixture by combining oxygen and hydrogen in a remote steam generator. Other embodiments may ionize the gas mixture to some degree, even forming a plasma if convenient.

In some embodiments, two surfaces of the substrate may be subjected to rapid thermal oxidation in a single process. The two surfaces may be treated simultaneously or consecutively. In other embodiments, the two surfaces may be treated in separate processes. Simultaneous thermal treatment of the two surfaces may be advantageous in some embodiments because additional processing steps such as wet cleaning are avoided.

In most embodiments, the substrate is rapidly heated to a target temperature between about 800° C. and about 1,200° C., such as between about 900° C. and about 1,100° C., for example about 1,000° C. The pressure in the process chamber is generally maintained between about 100 mTorr and 10 Torr, such as about 8 Torr. In embodiments featuring a gas mixture comprising oxygen and hydrogen, the partial pressure of hydrogen may be maintained between about 2 Torr and about 8 Torr, such as about 6.5 Torr, to achieve rapid oxidation of the surfaces. In one exemplary process, hydrogen gas may be provided to the chamber initially while the temperature of the substrate is increased to the target value. Oxygen may then be added to the mixture and increased to a target value to cause rapid oxidation. In most embodiments, the rate of heating applied to the substrate will be high, such as between about 200° C. and about 400° C., and may be generated by using a heated substrate support and/or various forms of radiant energy, such as heat lamps.

A layer of oxide is formed by the rapid thermal oxidation process at 306. The oxide layer may have a thickness of between about 20 Angstroms and about 150 Angstroms, such as between about 40 Angstroms and about 100 Angstroms, for example about 70 Angstroms. The oxide layer passivates both surfaces of the substrate. In some embodiments, the oxide layer formed over the doped surface may be thinner than that formed over the undoped surface. In some embodiments, the oxide layer formed over the doped surface has a thickness less than about 150 Angstroms, while the oxide layer formed over the undoped surface has a thickness of up to 100 nm.

In many embodiments, the thermal process substantially diffuses dopants deeper into the substrate. This substantial additional diffusion may reduce a concentration of dopant at the surface of the substrate by at least 10%, and in some embodiments by 50-90%. The rate of change of concentration with depth may be reduced up to 50% in some embodiments as well. Whereas the doped layer may have a thickness between about 100 nm and about 300 nm before the thermal treatment, that thickness may grow to 300 nm to 500 nm after the thermal treatment. In some embodiments, the thickness of the doped layer may double after thermal treatment. The average concentration profile may be modified in some embodiments from a profile having a rate of concentration decay between about 50 nm/dec and about 100 nm/dec to a profile having a rate of concentration decay between about 100 nm/dec and about 300 nm/dec. In some embodiments, the diffusion of dopant into the substrate may form regions of slow concentration decay with depth and regions of fast concentration decay with depth. In one embodiment, a region of slow concentration decay may have a thickness between about 100 nm and about 300 nm, and may have an average rate of concentration decay between about 200 nm/dec and about 500 nm/dec. In another embodiment, a region of fast concentration decay may have a thickness between about 100 nm and about 300 nm, and may have an average rate of concentration decay between about 100 nm/dec and about 200 nm/dec.

At 308, a dielectric layer is formed over the two surfaces of the substrate. The dielectric layer may comprise oxygen, nitrogen, hydrogen, carbon, or combinations thereof, depending on the needs of particular embodiments. In one embodiment, a nitride layer may be formed over the two surfaces. The dielectric layer may further passivate the surfaces of the substrate, and may also serve as an anti-reflective coating to prevent loss of incident radiation by reflection. In some embodiments, the dielectric layer may be formed over only the doped surface of the substrate, leaving the passivating oxide layer over the undoped surface exposed. The dielectric layer may be formed by any convenient process, such as chemical vapor deposition, which may be plasma-enhanced, physical vapor deposition, atomic layer deposition, and the like. The dielectric layer may have a dielectric constant of about 6 or less, such as between about 2 and 6. In some embodiments, the dielectric layer may have a dielectric constant of between about 4 and about 6. In other embodiments, the dielectric layer may have a dielectric constant of between about 2 and about 4.

A 310, an optical reflector is formed over the dielectric layer covering the undoped surface of the substrate. Generally used in embodiments featuring an anti-reflective layer formed over the undoped surface of the substrate, the optical reflector prevents loss of transmitted radiation by reflecting it back into the substrate bulk. The optical reflector may be of any suitable metal, such as aluminum, and is deposited on the surface by any convenient process, such as sputtering or evaporation.

It should be noted that use of a thermal process to form a passivating layer, as described above, improves the performance of all passivating layers in the structure. The high surface dopant concentration of prior art solar cells, and the high charge content thereof, reduces the passivating effect of a nitride layer by masking the charge content of the nitride layer. Free electrons in the bulk layer may drift closer to the doped layer and may recombine with holes migrating toward the doped layer. Smoothing and deepening the concentration profile of the dopant reduces recombination of charge carriers by repelling electrons toward the undoped surface and by transmitting the electron-repelling effect of the passivating layer. Use of such a process may obviate the need for doping two surfaces in some embodiments, allowing for solar cells with a single doped surface, with the opposite surface having a dielectric passivation layer.

While the foregoing is directed to embodiments of the invention, other and further embodiments of the invention may be devised without departing from the basic scope thereof, and the scope thereof is determined by the claims that follow.

What is claimed is:

1. A method of forming a solar cell on a semiconductor substrate comprising:
   doping a first surface of the semiconductor substrate with a n-type dopant;
   forming a passivating layer over the first surface of the semiconductor substrate, and over a second surface of the semiconductor substrate; and
   forming a dielectric layer over the first and second surfaces of the semiconductor substrate, wherein forming the passivating layer over the first and second surfaces of the semiconductor substrate comprises forming a film comprising oxygen on the first and second surfaces, each film having a thickness between about 20 Angstroms and about 150 Angstroms.

2. The method of forming a solar cell on a semiconductor substrate according to claim 1, wherein the dielectric layer comprises nitrogen.

3. The method of forming a solar cell on a semiconductor substrate according to claim 1, further comprising forming a reflective layer over the second surface.

4. The method of forming a solar cell on a semiconductor substrate according to claim 3, wherein the passivating layer is formed by a rapid thermal oxidation process.

5. The method of forming a solar cell on a semiconductor substrate according to claim 1, wherein the passivating layer comprises nitrogen.

6. The method of forming a solar cell on a semiconductor substrate according to claim 1, wherein applying the passivating layer to the first and second surfaces comprises smoothing a concentration profile of the n-type dopant.

7. A method of forming a solar cell on a semiconductor substrate comprising:
   doping a first surface of the semiconductor substrate with a n-type dopant;
   forming a passivatinq layer over the first surface of the semiconductor substrate, and over a second surface of the semiconductor substrate; and
   forming a dielectric layer over the first and second surfaces of the semiconductor substrate, wherein applying the passivating layer comprises reducing a concentration of the n-type dopant on the first surface by at least 10%.

8. A method of forming a solar cell on a semiconductor substrate comprising:
   doping a first surface of the semiconductor substrate with a n-type dopant;

forming a passivatinq layer over the first surface of the semiconductor substrate, and over a second surface of the semiconductor substrate; and forming a dielectric layer over the first and second surfaces of the semiconductor substrate, wherein applying the passivating layer comprises modifying the concentration profile of the n-type dopant in the semiconductor substrate from a decay rate of between about 50 nm/dec and about 100 nm/dec to a decay rate of between about 100 nm/dec to about 300 nm/dec.

9. A method of passivating a doped solar cell substrate, comprising:

disposing the solar cell substrate in a processing chamber;

providing a gas mixture comprising oxygen to the processing chamber; and heating the solar cell substrate to a predetermined temperature selected to form an oxygen-containing film on at least two surfaces of the solar cell substrate and to cause dopants in the doped solar cell substrate to diffuse into the solar cell substrate.

10. The method of passivating a doped solar cell substrate according to claim 9, wherein the oxygen-containing film is an oxide film.

11. The method of passivating a doped solar cell substrate according to claim 9, wherein the oxygen-containing film has a thickness less than 100 Angstroms.

12. The method of passivating a doped solar cell substrate according to claim 9, wherein heating the substrate to a predetermined temperature reduces the concentration of the dopant on the surface of the doped solar cell by at least 10%.

13. The method of passivating a doped solar cell substrate according to claim 9, wherein the oxygen-containing film is an anti-reflective coating.

14. The method of passivating a doped solar cell substrate according to claim 12, wherein heating the substrate to a predetermined temperature decreases a rate of decay of concentration with depth in the substrate.

15. The method of passivating a doped solar cell substrate according to claim 14, wherein the rate of decay in concentration is reduced by at least about 50%.

16. The method of passivatinq a doped solar cell substrate according to claim 9, further comprising forming a dielectric layer over the oxygen-containing film on the at least two surfaces of the substrate.

17. The method of passivating a doped solar cell substrate according to claim 9, further comprising performing a wet clean process on the substrate.

18. The method of passivatinq a doped solar cell substrate according to claim 9, wherein the gas mixture further comprises hydrogen.

19. The method of passivatinq a doped solar cell substrate according to claim 18, wherein the partial pressure of hydrogen in the reaction mixture is at least about 500 mTorr.

* * * * *

UNITED STATES PATENT AND TRADEMARK OFFICE
CERTIFICATE OF CORRECTION

PATENT NO. : 7,838,400 B2  
APPLICATION NO. : 12/175357  
DATED : November 23, 2010  
INVENTOR(S) : Borden Page 1 of 1

It is certified that error appears in the above-identified patent and that said Letters Patent is hereby corrected as shown below:

In the Claims:

Column 8, Claim 7, Line 57, please delete "passivatinq" and insert --passivating-- therefor;

Column 9, Claim 8, Line 1, please delete "passivatinq" and insert --passivating-- therefor;

Column 10, Claim 16, Line 13, please delete "passivatinq" and insert --passivating-- therefor;

Column 10, Claim 18, Line 20, please delete "passivatinq" and insert --passivating-- therefor;

Column 10, Claim 19, Line 23, please delete "passivatinq" and insert --passivating-- therefor.

Signed and Sealed this  
Twenty-first Day of June, 2011

David J. Kappos  
*Director of the United States Patent and Trademark Office*